United States Patent
Ishida et al.

(10) Patent No.: US 6,342,423 B1
(45) Date of Patent: Jan. 29, 2002

(54) MOS-TYPE TRANSISTOR PROCESSING UTILIZING UV-NITRIDE REMOVABLE SPACER AND HF ETCH

(75) Inventors: Emi Ishida, Sunnyvale; Srinath Krishnan, Campbell; Ming Yin Hao; Effiong Ibok, both of Sunnyvale, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/667,781

(22) Filed: Sep. 22, 2000

Related U.S. Application Data
(60) Provisional application No. 60/155,553, filed on Sep. 24, 1999.

(51) Int. Cl.$^7$ .................. H01L 21/8238; H01L 21/336
(52) U.S. Cl. .................. 438/303; 438/305; 438/230
(58) Field of Search .................. 436/303, 199, 436/304, 305, 231, 230, 232

(56) References Cited

U.S. PATENT DOCUMENTS

| | | |
|---|---|---|
| 4,722,909 A | 2/1988 | Parrillo et al. |
| 4,745,086 A | 5/1988 | Parrillo et al. |
| 5,700,580 A | 12/1997 | Becker et al. |
| 5,756,216 A | 5/1998 | Becker et al. |
| 5,766,991 A | 6/1998 | Chen |
| 5,804,856 A * | 9/1998 | Ju .............................. 257/344 |
| 6,103,563 A * | 8/2000 | Lukanc et al. ............. 438/231 |
| 6,153,455 A * | 11/2000 | Ling et al. .................. 438/231 |
| 6,214,655 B1 * | 4/2001 | Lee et al. ................... 438/199 |
| 6,218,224 B1 * | 4/2001 | Lukanc et al. ............. 438/199 |
| 6,221,706 B1 * | 4/2001 | Lukanc et al. ............. 438/199 |
| 6,225,174 B1 * | 5/2001 | Jeng et al. .................. 438/303 |
| 6,232,191 B1 * | 5/2001 | Jeng et al. .................. 438/303 |

* cited by examiner

*Primary Examiner*—John F. Niebling
*Assistant Examiner*—Walter L. Lindsay, Jr.

(57) ABSTRACT

Submicron-dimensioned MOS and/or CMOS transistors are fabricated by a process employing removable sidewall spacers made of a material, such as UV-nitride, which is readily etched in its as-deposited, undensified state but difficult-to-etch in its thermally annealed, densified state. The as-deposited, undensified spacers are removed by etching with dilute aqueous HF after implantation of heavily-sloped source/drain junction regions but prior to annealing of the implant for dopant diffusion/activation and lattice damage relaxation. Lightly-or moderately doped, shallow-depth source/drain extensions are implanted and annealed after spacer removal.

19 Claims, 2 Drawing Sheets

MOS-TYPE TRANSISTOR PROCESSING UTILIZING UV-NITRIDE REMOVABLE SPACER AND HF ETCH

RELATED APPLICATIONS

This application claims priority from Provisional Application Ser. No. 60/155,553, filed on Sep. 24, 1999 entitled: "MOS-TYPE TRANSISTOR PROCESSING UTILIZING UV-NITRIDE REMOVABLE SPACER AND HP ETCH", the entire disclosure of which is incorporated by reference herein.

FIELD OF THE INVENTION

The present invention relates to a method of manufacturing MOS-type transistor devices and semiconductor integrated circuits with improved processing methodology resulting in increased reliability and quality, increased, manufacturing throughout, and reduced fabrication cost. The present invention is also useful in the manufacture of CMOS semiconductor devices and has particular applicability in fabricating high-density integration semiconductor devices with design features below about 0.18 µm, e.g., about 0.15 µm.

BACKGROUND OF THE INVENTION

The escalating requirements for high density and performance associated with ultra large-scale integration (ULSI) semiconductor devices requires design features of 0.18 µm and below, such as 0.15 µm and below, increased transistor and circuit speeds, high reliability, and increased manufacturing throughput for economic competitiveness. The reduction of design features to 0.18 µm and below challenges the limitations of conventional semiconductor manufacturing techniques.

As feature sizes of MOS and CMOS devices have decreased to the sub-micron range, so-called "short-channel" effects have arisen which tend to limit device performance. For n-channel MOS transistors, the major limitation encountered is caused by hot-electron-induced instabilities. This problem occurs due to high electrical fields between the source and the drain, particularly near the drain, such that charge carriers, either electrons or holes, are injected into the gate or semiconductor substrate. Injection of hot carriers into the gate can cause gate oxide charging and threshold voltage instabilities which accumulate over time and greatly degrade device performance. In order to counter and thus reduce such instabilities, lightly- or moderately-doped source/drain extension-type transistor structures have been developed, as described below.

For p-channel MOS transistors of short-channel type, the major limitation on performance arises from "punch-through" effects which occur with relatively deep junctions. In such instances, there is a wider subsurface depletion effect and it is easier for the field lines to go from the drain to the source, resulting in the above-mentioned "punch-through" current problems and device shorting. To minimize this effect, relatively shallow junctions are employed in forming p-channel transistors.

The most satisfactory solution to date of hot carrier instability problems of MOS devices is the provision of light- or moderately-doped source/drain extensions driven just under the gate region, while the heavily-doped drain region in internally disposed away from the gate by use of a sidewall spacer on the gate. Such structures are particularly advantageous because they do not have problems with large lateral diffusion and the channel length can be set precisely.

Several processing sequences or schemes have been developed for the manufacture of source/drain extension-type MOS and CMOS transistors for use in high-density integration applications, with a primary goal of simplifying the manufacturing process by reducing and/or minimizing the number of processing steps. Conventional processing schemes for making such MOS transistors generally employ disposable spacers made of various materials, e.g., polysilicon, silicon oxides, silicon nitrides, silicon oxynitrides, and combinations thereof.

According to one conventional process scheme, a precursor structure comprising a semiconductor substrate of one conductivity type having a layer stack comprising a thin gate oxide layer and on overlying gate electrode formed on a portion of a surface thereof is subjected to ion implantation prior to sidewall formation for forming lightly- or moderately-doped implants therein. Following post-implantation annealing, sidewall spacers are formed on the pair of opposing side surfaces of the layer stack by first depositing a dielectric spacers material layer over the substrate surfaces and then removing same from the horizontal regions, i.e., the top surface of the gate electrode layer, and the source and drain regions, by anisotropically etching. Such processing results in sidewall spacers left on the gate layer stack side surfaces that have an approximately quarter-circular cross-section. The dielectric sidewall spacers typically remain through the balance of junction formation processing. After sidewall spacer formation, a heavy source/drain implantation is performed, with the gate layer stack and associated sidewall spacers acting as implantation masking materials. As a consequence of the separate implantations, the heavily-doped source/drain regions are laterally displaced from the gate edges by the thickness of the sidewall spacer material and the lightly- or moderately-doped regions beneath the sidewall spacers act as source/drain extensions.

According to another conventional process scheme, which scheme employs disposable (i.e., removable) spacers, a precursor structure as described above and comprising a semiconductor substrate of one conductivity type having a layer stack comprising a thin gate oxide layer and an overlying gate electrode layer formed on a portion of a surface thereof is subjected to dielectric layer deposition and patterning to form sidewall spacer layers on opposing side surfaces of the layer stack. Opposite conductivity type P- and N- type dopant impurities are then implanted into the substrate using the layer stack with sidewall spacers formed thereon as an implantation mask to form moderately to heavily-doped implants. High temperature annealing is then performed to thermally activate the implanted dopant by diffusion and reduce lattice damage due to implantation, thereby forming source/drain regions and junctions at a predetermined dopant density and depth below the substrate surface. The effective length of the channel length of such transistors is determined by the width of the gate insulator/gate electrode layer stack and the width of the sidewall spacers formed thereon. After activation annealing, the sidewall spacers are removed, as by etching, and a second implantation process for implanting N- or P-type opposite conductivity type dopant impurities is performed using only the gate insulator layer/gate electrode layer stack as an implantation mask, thereby forming shallow-depth, lightly- or moderately-doped intermediate implants in the substrate in the spacers between the deeper, more heavily-doped source/drain region. Following the implantation, a second activation process, e.g., rapid thermal annealing (RTA), is performed for effecting dopant diffusion and relaxation of implantation induced lattice damage of the intermediate implants, to form shallow-depth, lightly- or moderately-doped source/drain extensions extending from respective proximal edges of the heavily-doped source/drain regions to just below the respective proximal edges of the gate insulator layer/gate electrode layer stack.

The above-described process, which employs removable sidewall spacers as part of the implantation mask for defining the channel lengths, incurs a drawback in that the materials conventionally used for the sidewall spacers, such as those enumerated above, are frequently difficult and time consuming to remove by standard etching methodologies. For example, and as described in U.S. Pat. No. 5,766,991, removal of silicon nitride-based spacer layers can require etching in a hot phosphoric acid ($H_3PO_4$) bath at about 180° C. for approximately 1.5 hours. Such long etching time results in reduced manufacturing throughput and the extended exposure to and concomitant attack by the corrosive reagent at high temperature results in undesired etching and defect formation. Moreover, portions of the workpiece substrate not intended to be etched must be provided with an etch-resistant protective barrier layer, e.g. of silicon oxide, prior to etching. However, the etching resistance to the hot phosphoric acid of the silicon oxide layer itself may be insufficient, in which case the resistance thereof must be increased prior to etching, e.g., by first annealing it at about 900° C. in an oxygen ambient. Alternatively, resistance to attack by the hot $H_3PO_4$ may be obtained by use of an oxide-polysilicon bi-layer. In either case, such requirement for provision of at least one layer for protecting from acid attack disadvantageously adds to processing time, complexity, and fabrication cost.

Thus a need exists for improved semiconductor manufacturing methodology for fabricating MOS and CMOS transistors which does not suffer from the above-described drawbacks associated with the difficulty in conveniently and rapidly removing sidewall spacers according to conventional etching techniques. Moreover, there exists a need for an improved process for fabricating MOS transistor-based devices which is fully compatible with conventional process flow and provides increased manufacturing throughput and product yield.

The present invention fully addresses and solves the above described problems and drawbacks attendant upon conventional processing for forming submicron-dimensioned, MOS and CMOS transistors for use in high-density semiconductor integrated circuit devices, particularly in providing a process utilizing a dielectric sidewall spacer material which is easily and rapidly etched in its as-deposited, undensified state but difficult-to-etch in its annealed, densified state, wherein the undensified spacers are removed prior to any post-implantation thermal annealing treatment for dopant activation and lattice damaged relaxation.

DISCLOSURE OF THE INVENTION

An advantage of the present invention is an improved method for manufacturing MOS and/or CMOS transistor device utilizing a removable sidewall spacer.

Another advantage of the present invention is an improved method for manufacturing MOS and/or CMOS transistor devices utilizing a removable sidewall spacer formed of a readily etchable material.

Another advantage of the present invention is an improved method of manufacturing submicron-dimensioned MOS transistors for use in high-density semiconductor integrated circuit devices at lower cost, higher manufacturing throughput, and increased product yield than are obtainable with conventional process methodology.

Additional advantages and other features of the present invention will be set forth in the description which follows and in part will become apparent to those having ordinary skill in the art upon examination of the following or may be learned from the practice of the instant invention. The advantages of the present invention may be realized and obtained as particularly pointed out in the appended claims.

According to an aspect of the present invention, the foregoing and other advantages are achieved in part by a method of manufacturing a semiconductor device, which method comprises the sequential steps of:

(a) providing a device precursor structure comprising a semiconductor substrate of a first conductivity type and a layer stack formed on a portion of a surface of the substrate, the layer stack comprising:
  i. a thin gate insulating layer in contact with the substrate surface; and
  ii. a gate electrode layer formed on the gate insulating layer, the layer stack comprising a pair of opposing side surfaces and a top surface;

(b) forming insulative, tapered sidewall spacers on each of the pair of opposing side edge surfaces, the insulative spacers comprising a material which is readily etched in its as-deposited, undensified state but difficult-to-etch in its annealed, densified state;

(c) selectively introducing dopant impurities of a second, opposite conductivity type into exposed portions of the substrate surface adjacent the sidewall spacers to form a pair of spaced-apart, heavily-doped regions in the substrate;

(d) removing the as-deposited, undensified sidewall spacers by etching;

(e) treating the pair of spaced-apart heavily-doped regions to form a pair of heavily-doped source/drain junction regions in the substrate at a predetermined depth below the substrate surface, each of the heavily-doped source/drain junction regions being laterally spaced from a respective proximal edge of the gate insulating layer by a distance substantially equal to the width of the lower ends of the sidewall spacers;

(f) selectively introducing second, opposite conductivity type dopant impurities into exposed portions of the substrate surface intermediate the gate insulating layer and the heavily-doped source/drain junction regions to from light- or moderately-doped extension regions therein; and (g) treating the lightly- or moderately-doped extension regions to form a pair of shallow-depth, lightly- or moderately-doped source/drain extensions in the substrate; each of the shallow-depth, lightly- or moderately-doped source/drain extensions extending from a proximal edge of a respective source/drain junction region is beneath a respective proximal edge of the gate insulating layer.

In embodiments according to the present invention, the method further comprises the step of:

(g) forming insulative sidewall spacers of predetermined width profile along each of the opposing side edge surfaces of the layer stack, the insulative sidewall spacers comprising at least one material selected from polysilicon, silicon oxides, silicon nitrides, silicon oxynitrides, and UV nitrides.

According to further embodiments of the present invention, step (a) comprises providing a semiconductor substrate of n or p first conductivity type, preferably a silicon wafer substrate, the thin gate insulating layer comprises a silicon oxide layer about 25–50 Å thick, and the gate electrode layer comprises heavily-doped polysilicon; step (b) comprises forming the insulative sidewall spacers from a UV-nitride deposited in an undensified state, the spacers being tapered, the spacers decreasing in width from a relatively wide width at the lower ends thereof in contact with the substrate surface to a relatively narrow width at the upper ends thereof, the spacers being formed by a process comprising blanket-depositing the UV_nitride layer over the substrate surface and the opposing side edge and top surfaces of the layer stack, followed by selectively removing portions of the UV-nitride layer overlying the substrate surface and the top surface of the layer stack by anisotropic etching step (c) comprises selectively introducing p or n second, opposite conductivity type dopant impurities by ion implantation, preferably by implanting dopant impurities in an amount sufficient to provide heavily-doped, relatively deep source/drain regions; step (d) comprises removing the UV-nitride sidewall spacers at a relatively rapid rate by etching with dilute aqueous HF, preferably 1:100 HF at a moderate temperature; step (e) comprises rapid thermal annealing (RTA) at a temperature of from about 1,000° C. to about 1,100° C. for from about 45 sec. to diffuse and activate the dopant impurities introduced during step (c); step (f) comprises selectively introducing p or n second, opposite conductivity type dopant impurities by ion implantation, preferably by implanting dopant impurities in an amount sufficient to provide lightly- or moderately-doped, shallow source/drain junction extension regions; and step (g) comprises RTA at from about 900 to about 1,000° C., for from about 10 sec. to about 45 sec. to diffuse and activate the dopant impurities introduced during step (f).

According to another aspect of the present invention, a method of manufacturing a silicon-based MOS transistor is provided, which method comprises the sequential steps of:

(a) providing a MOS transistor precursor structure comprising a silicon semiconductor wafer substrate of a first conductivity type and a layer stack formed on a portion of a surface of the wafer, the layer stack comprising:

i. a thin gate insulating layer comprising a silicon oxide layer about 25–50 Å thick in contact with the wafer surface; and ii. a gate electrode layer comprising heavily-doped polysilicon formed on the gate insulating layer, the layer stack comprising a pair of opposing side surfaces and a top surface;

(b) forming insulative, tapered sidewall spacers on each of the pair of opposing side surfaces, the insulative spacers comprising a UV-nitride material which is readily etched in its as-deposited, undensified state but difficult-to-etch in its annealed, densified state;

(c) selectively implanting dopant impurities of a second, opposite conductivity type into exposed portions of the wafer surface adjacent the sidewall spacers to form a pair of spaced-apart, heavily-doped implants in the wafer;

(d) removing the as-deposited, undensified UV-nitride sidewall spacers by etching with dilute aqueous HF, preferably at a relatively rapid rate with 1:100 HF/H$_2$O at moderate temperatures;

(e) performing rapid thermal annealing to diffuse and activate the dopant impurities implanted in step (c), thereby forming a pair of heavily-doped, relatively deep source/drain junction regions in the wafer, each of the heavily-doped source/drain junction regions being laterally spaced from a respective proximal edge of the gate insulating layer by a distance substantially equal to the width of the lower ends of the sidewall spacers;

(f) selectively implanting second, opposite conductivity type dopant impurities into exposed portions of the wafer surface intermediate the gate insulating layer and the heavily-doped source/drain junction region to form lightly- or moderately-doped source/drain extension implants therein; and (g) performing thermal annealing to diffuse and activate the dopant impurities implanted in step (f), thereby forming a pair of shallow-depth, lightly- or moderately-doped source/drain extensions in the wafer, each of the shallow-depth, lightly- or moderately-doped source/drain extensions extending from a proximal edge of a respective source/drain region to beneath a respective proximal edge of the gate insulating layer.

In embodiments according to the present invention, the method further comprises the step of:

(h) forming insulative sidewall spacers along each of the pair of opposing side surfaces of the layer stack, the spacers comprising at least one insulative material selected from polysilicon, silicon oxides, silicon nitrides, silicon oxynitrides, and UV-nitrides.

According to yet another aspect of the present invention, silicon-based MOS transistor devices formed by the method of the above-enumerated steps (a)–(h) are provided.

Additional advantages and aspects of the present invention will become readily apparent to those skilled in the art from the following detailed description, wherein only the preferred embodiment of the present invention is shown and described, simply by way of illustration of the best mode contemplated for carrying out the method of the present invention. As will be described, the present invention is capable of other and different embodiments, and its several details are susceptible of modification in various obvious respects, all without departing from the spirit of the present invention. Accordingly, the drawing and description are to be regarded as illustrative in nature, and not as limitative.

DESCRIPTION OF THE INVENTION

The present invention addresses and solves problems arising from manufacturing submicron-dimensioned, MOS and CMOS transistors suitable for use in high-density integration semiconductor devices, wherein, as part of the fabrication methodology, sidewall spacers which act as an implantation mask during the formation of moderately to heavily-doped source/drain regions are removed, as by etching, prior to implantation for forming lightly or moderately-doped source/drain extensions. More specifically, the present invention advantageously provides a significant and substantial reduction in the duration and corrosive severity of the requisite anisotropic etching step for removing the sidewall spacers, thereby increasing device reliability and manufacturing throughput, while decreasing fabrication cost and product yield problems associated with the conventional technology. In addition, the inventive method is fully compatible with other aspects of existing processing methodology.

According to the present invention, a method of manufacturing MOS and CMOS transistors is provided which utilizes a dielectric sidewall spacer material which is easily and rapidly etched in its as-deposited, undensified state but difficult-to-etch in its annealed, densified state, and the undensified sidewall spacers are removed prior to any post-implantation thermal annealing treatment for dopant activation and lattice damage relaxation.

Figure 1A:
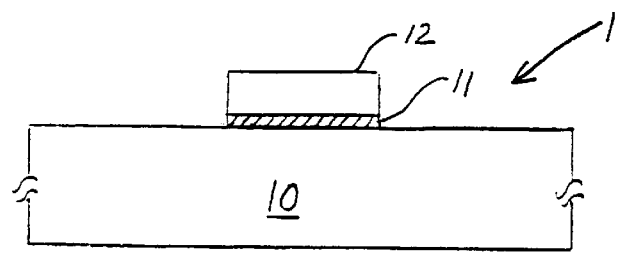
FIGS. 1(A)–1(I) illustrate, in simplified, cross-sectional form, a sequence of processing steps for forming an MOS transistor according to an embodiments of the present invention.

Referring now to FIGS. 1(a)–1(G), shown therein is a sequence of steps for performing an illustrative, but not limitative, embodiment of the present invention, wherein similar reference numerals denote similar features. Referring more particularly to FIG. 1(A), in a first step, a MOS device precursor 1, fabricated according to conventional techniques not described herein for brevity, is provided, comprising a doped monocrystalline silicon (Si) wafer substrate 10 of first conductivity type (p or n), with a thin gate dielectric layer 11, typically of a silicon oxide about 25–50 Å thick, formed on a portion of the substrate surface destined to overlie the channel region of the transistor. Contiguous and forming a layer stack with the gate dielectric layer 11 is a thicker gate electrode layer 12, typically of heavily-doped polysilicon, for providing electrical contact to the gate or channel region.

Figure 1B:
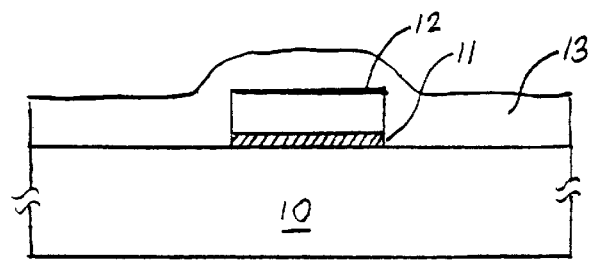

Referring now to FIG. 1(B), a layer 13 of UV-nitride is blanket-deposited over the top and side surfaces of the dielectric gate oxide 11/gate electrode 12 layer stack and exposed surface of the Si substrate 10. UV-nitride layers formed in such manner are undensified as-deposited and readily etchable, e.g., with dilute aqueous HF, typically 1:100 HF/$H_2O$ at moderate temperatures, whereas densified UV-nitride layers, such as are obtained subsequent to annealing treatment at elevated temperatures, are difficult-to-etch under essentially equivalent conditions.

Figure 1C:
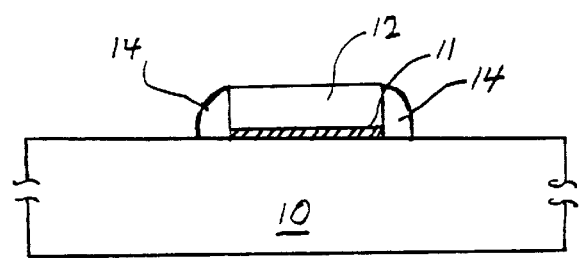

FIG. 1(C) shows the result of anisotropic etching of the horizontally oriented surfaces of the as-deposited, undensified UV-amide layer 13 using dilute aqueous HF according to the conditions described supra. Selective removal of the horizontally oriented portions of the UV-nitride layer overlying the substrate 10 surface and the upper surface of the gate electrode layer 12 results in the formation of roughly quarter circle-shaped sidewall spacer portions 14, having a tapered width profile in cross-section varying in width from relatively wide widths at the lower ends thereof in contact with the surface of substrate 10 to relatively narrow widths at their upper ends. Selective anisotropic etching of the as-deposited, undensified UV-nitride layer is performed so as to yield a desired width of the sidewall spacers 14 at their lower ends, which width is selected for optimization of the subsequently formed lightly-doped source/drain extension regions of the transistor.

Figure 1D:
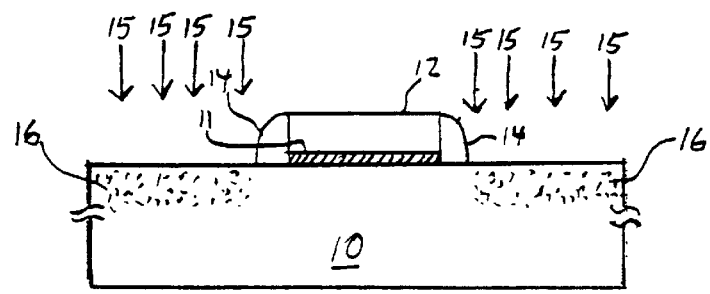

Adverting to FIG. 1(D), following formation of sidewall spacers 14 of predetermined width profile, dopant-containing ions 15 of second conductivity type opposite that of substrate 10 are selectively implanted, with layer stack 11/12 and associated sidewall spacers 14 acting as implantation masks, to form heavily-doped implants 16 Dopant ion implantation is performed at a dosage and energy selected for optimal transistor performance. For example, by way of illustration but not limitation, for a p-type Si substrate intended to comprise an n-channel transistor, n-type dopant impurities (typically chosen from phosphorus (P, arsenic (As), and antimony (Sb)) are implanted at a dosage of about $5\times10^{14}$ to about $5\times10^{15}$ atoms/$cm^2$ at an energy of from about 40 KeV to about 60 KeV. Conversely, for an n-type Si substrate intended to comprise a p-channel transistor, p-type dopant impurities (typically boron) are implanted at similar dosages but at lower energies of from about 20 KeV to about 40 KeV.

Figure 1E:
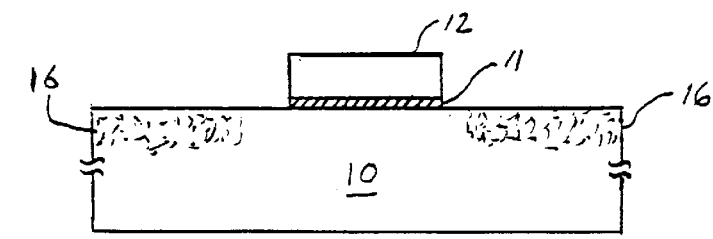

With reference to FIG. 1(E), and according to an essential aspect of the present invention, in the following step the as-deposited, undensified sidewall spacers 14 are removed by etching. Inasmuch as the spacer removal is prior rather than subsequent to high temperature annealing treatment for diffusing the implanted dopant and relaxing lattice damage/stresses resulting from implantation, which thermal treatment densifies and renders the UV-nitride difficult-to-etch, etching is readily performed in a manner similar to that previously utilized for forming the spacers 14 from blanket layer 13. Such etching typically comprises treating with dilute, aqueous HF (e.g., 1:100 HF:$H_2O$) at moderate temperatures, for an interval sufficient to remove the sidewall spacers, at relatively rapid removal rates. As compared with the about 1.5 hour interval required for etching of silicon nitride sidewall spacers with hot $H_3PO_4$ at 180° C. according to the prior art, the process of the instant invention provides a substantial and significant reduction in the requisite etching duration and corrosive severity of the etching conditions, thereby simultaneously increasing manufacturing throughput and reducing corrosive attack and resultant damage to the workpiece.

Figure 1F:
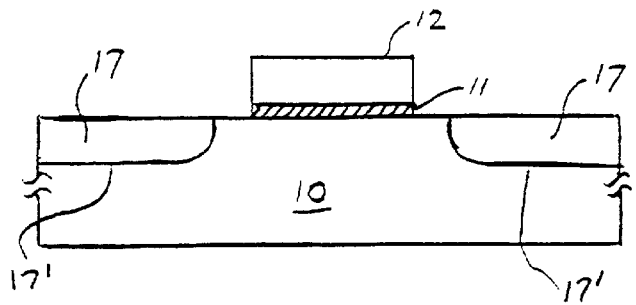

Referring now to FIG. 1(F), following removal of sidewall spacers 14, the thus-formed transistor precursor is treated, as by rapid-thermal annealing (RTA), for effecting diffusion of the implanted dopant ions and formation of source/drain junction regions 17 having a predetermined junction 17' depth below the substrate surface. In the case of heavily-doped n-type source/drain regions 17, RTA is conducted at a temperature of from about 1,000 to about 1,100° C, typically about 1,050° C., for from about 10 to about 45 seconds, typically about 30 seconds, to activate and diffuse the dopant and reduce/relax lattice damage/distortion resulting from the implantation process. In the case of heavily-doped p-type source/drain regions 17, RTA is performed at a temperature of from about 900 to about 1,000° C., typically about 1,000° C., for from about 10 to about 45 seconds, typically about 30 seconds, for effecting dopant activation, diffusion, and lattice damage relaxation.

Figure 1G:
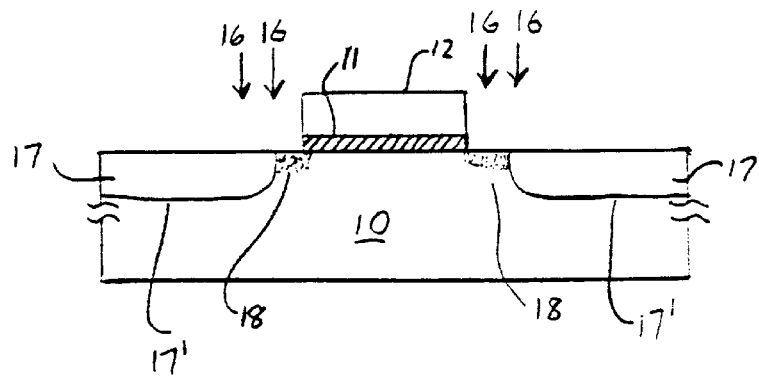

Referring now to FIG. 1(G), in the next step according to the invention method, dopant-containing ions 16 of opposite, second conductivity type are selectively implanted to form highly- or moderately-doped, shallow-depth extension implants 18 in the spaces between the to heavily-doped source/drain junction regions 17 and just underlying the respective proximal edges of gate insulator/gate electrode layer stack 11/12. Implantation is performed at lower dosages and energies the an previously employed for forming the heavily-doped source/drain junction regions 17. In the case of n-type dopant impurities 16, implantation is performed at a dosage of from about $5\times10^{13}$ to about $5\times10^{14}$ atoms/$cm^2$ and at an energy of from about 10 KeV to about 30 KeV. In the case of p-type dopant impurities 16, implantation is performed at a similar dosage but at a lower energy of from about 5 KeV to about 10 KeV.

Figure 1H:
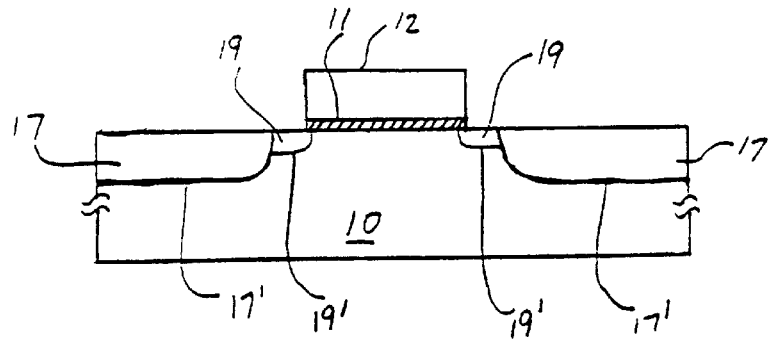

With reference to FIG. 1(H), the thus-implanted structure is then subjected to a treatment, typically RTA, for activating/diffusing the implanted dopant impurities 16 in the lightly- or moderately-doped, shallow-depth regions 18 and for relaxation of lattice damage/stress resulting from the implantations process.

Figure 1I:
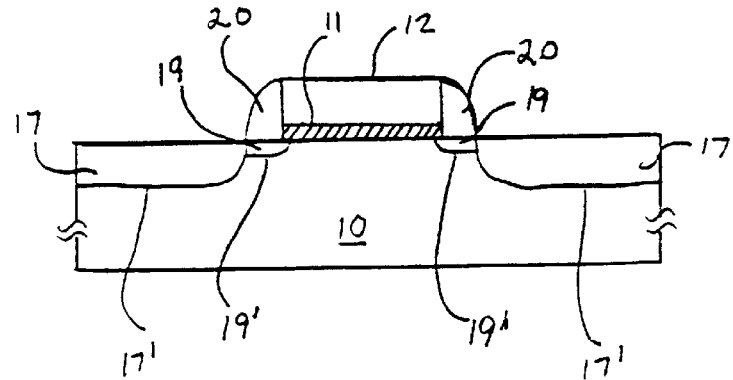

As shown in FIG. 1(I) insulative sidewall spacers 20 and then formed, as by conventional techniques not described herein for brevity, along the opposing side surfaces of the gate insulator layer/gate electrode layer stack 11/12, for protecting the layer stack and source/drain extensions regions 19 during subsequent processing, e.g., contact formation and metallization processing. Sidewall spacers may comprise one or more dielectric material layers selected from polysilicon, silicon oxides, silicon nitrides, silicon oxynitrides, and UV-nitrides.

The present invention thus enables formation of reliable, defect-free submicron-dimensioned MOS transistors at increased rates of manufacturing throughput, by utilizing a readily etchable material for the requisite dielectric sidewall spacers, which material provides a very significant reduction in the time necessary for etching processing. In addition, the etching is performed under milder conditions as compared with, e.g., the hot phosphoric acid etching processing according to the prior art.

Finally, the present invention is applicable to the formation of various types of submicron-dimensioned transistors, including CMOS transistors as well as MOS transistors and is fully compatible with conventional process flow for automated manufacture of high-density integration semiconductor devices.

In the previous description, numerous specific details are set forth, such as specific materials, structures, reactants, processes, etc., in order to provide a better understanding of the present invention, however, the present invention can be practiced without resorting to the details specifically set forth. In other instances, well-known processing materials and techniques have not been described in detail in order not to unnecessarily obscure the present invention.

Only the preferred embodiment of the present invention and but a few examples of its versatility are shown and described in the present disclosure. It is to be understood that the present invention is capable of use in various other combinations and environments and is susceptible of changes or modifications within the scope of the inventive concept as expressed herein.

What is claimed is:

1. A method of manufacturing a semiconductor device, which method comprises the sequential steps of:
   (a) providing a device precursor structure comprising a semiconductor substrate of a first conductivity type and a layer stack formed on a portion of a surface of said substrate, said layer stack comprising:
      i. a thin gate insulating layer in contact with said substrate surface; and
      ii. a gate electrode layer formed on said gate insulating layer, said layer stack comprising a pair of opposing side surfaces and a top surface;
   (b) forming insulative, tapered sidewall spacers of on each of said pair of opposing side surfaces, said insulative spacers comprising a material which is readily etched in its as-deposited, undensified state but difficult-to-etch in its annealed, densified state;
   (c) selectively introducing dopant impurities of a second, opposite conductivity type into exposed portions of said substrate surface adjacent said sidewall spacers to form a pair of spaced-apart, heavily-doped regions in said substrate;
   (d) removing the as-deposited, undensified sidewall spacers by etching;
   (e) treating said pair of spaced-apart heavily-doped regions to form a pair of heavily-doped source/drain junction regions in said substrate at a predetermined depth below said substrate surface, each of said heavily-doped source/drain junction regions being laterally spaced from a respective proximal edge of said gate insulating layer by a distance substantially equal to the width of the lower ends of said sidewall spacers;
   (f) selectively introducing second, opposite conductivity type dopant impurities into exposed portions of said substrates surface intermediate said gate insulating layer and said heavily-doped source/drain junction regions to form lightly- or moderately-doped extension regions; and
   (g) treating said lightly- or moderately-doped source/drain extension regions to form a pair of shallow-depth, lightly- or moderately-doped source/drain extensions in said substrate, each of said shallow-depth, lightly- or moderately-doped source/ drain extension extending from a proximal edge of a respective source/drain junction region to beneath a respective proximal edge of said gate insulating layer.

2. The method as in claim 1, wherein step (a) comprises providing a semiconductor substrate of n or p first conductivity type.

3. The method as in claim 2, wherein step (a) comprises providing a silicon wafer substrate of n or p first conductivity type, said thin gate insulating layer comprises a silicon-oxide layer about 25–50 Å thick, and said gate electrode layer comprises heavily-doped polysilicon.

4. The method as in claim 1, wherein step (b) comprises forming said insulative, tapered sidewall spacers from a UV-nitride deposited in an undensified state.

5. The method as in claim 4, comprising forming said insulative, tapered sidewall spacers wherein the widths thereof vary from relatively wide at the lower ends in contact with said substrate surface to relatively narrow at the upper ends.

6. The method as in claim 4, comprising:
   blanket-depositing said UV-nitride layer over said substrate surface and said opposing side and top surfaces of said layer stack; and
   selectively removing portions of said UV-nitride layer overlying said substrate surface and said top surface of said layer stack.

7. The method as in claim 2, wherein step (c) comprises selectively introducing p or n second, opposite conductivity type dopant impurities by ion implantation.

8. The method as in claim 7, comprising implanting dopant impurities in an amount sufficient to provide heavily-doped, relatively deep source/drain junction regions.

9. The method as in claim 4, wherein step (d) comprises removing and UV-nitride sidewall spacers by etching with dilute aqueous HF.

10. The method as in claim 9, comprising etching the sidewall spacers with 1:100 HF/$H_2O$ at a moderate temperature.

11. The method as in claim 2, wherein step (e) comprises rapid thermal annealing to diffuse and activate the dopant impurities introduced during step (c).

12. The method as in claim 2, wherein step (f) comprises selectively introducing p or n second, opposite conductivity type dopant impurities by ion implantation.

13. The method as in claim 12, comprising implanting dopant impurities in an amount sufficient to provide lightly- or moderately-doped, shallow depth, source/drain extension regions.

14. The method as in claim 2, wherein step (g) comprises rapid thermal annealing to diffuse and activate the dopant impurities introduced during step (f).

15. The method as in claim 1, further comprising the step of:
   (h) forming insulative, tapered sidewall spacers along each of said opposing side surfaces of said layer stack.

16. The method as in claim 15, wherein step (h) comprises forming said insulative sidewall spacers from at least one material selected from polysilicon, silicon oxides, silicon nitrides, silicon oxynitrides, and UV-nitrides.

17. A method of manufacturing a silicon-based MOS-type transistor, which method comprises the sequential steps of:
   (a) providing a MOS transistor precursor structure comprising a silicon semiconductor wafer substrate of a first conductivity type and a layer stack formed on a portion of a surface of said wafer, said layer stack comprising:
  i. a thin gate insulating layer comprising a silicon oxide layer about 25–50 Å thick in contact with said wafer surface; and
  ii. a gate electrode layer comprising heavily-doped polysilicon formed on said gate insulating layer, said layer stack comprising a par of opposing side surfaces and a top surface;
(b) forming insulative, tapered sidewall spacers on each of said pair of opposing side surfaces, said insulative spacers comprising a UV-nitride material which is readily etched in its as-deposited, undensified stated but difficult-to-etch in its annealed, densified state;
(c) selectively implanting dopant impurities of a second, opposite conductivity type into exposed portions of said wafer surface adjacent said sidewall spacers to form a pair of spaced-apart, heavily-doped source/drain implants in said wafer;
(d) removing the as-deposited, undensified UV-nitride sidewall spacers by etching with dilute aqueous HF;
(e) performing rapid thermal annealing to diffuse and activate the dopant impurities implanted in step (c), thereby forming a pair of heavily-doped, relatively deep, source/drain junction regions in said wafer, each of said heavily-doped source/drain junction regions being laterally spaced from a respective proximal edge of said gate insulating layer by a distance substantially equal to the width of the lower ends of said sidewall spacers;
(f) selectively implanting section, opposite conductivity type dopant impurities into exposed portions of said wafer surface intermediate said gate insulating layer and said heavily-doped source/drain junction regions to form lightly- or moderately-doped source/drain extension implants therein; and
(g) performing thermal annealing to diffuse and activate the dopant impurities implanted in step (f), thereby forming a pair of shallow-depth, lightly- or moderately-doped source/drain extensions in said wafer, each of said shallow-depth, lightly- or moderately-doped source/drain extensions extending from a proximal edge of a respective source/drain junction region to beneath a respective proximal edge of said gate insulating layer.

18. The method as in claim 17, wherein step (b) comprises forming said insulative sidewall spacers from a UV-nitride deposited in an undensified state; and step (d) comprises etching with 1:100 HF/$H_2O$ at a moderate temperature.

19. The method as in claim 17, further comprising the step of:
(h) forming insulative, tapered sidewall spacers of along each of said pair of opposing side edge surfaces of said layer stack, said spacers comprising at least one insulative material selected from polysilicon, silicon oxides, silicon nitrides, silicon oxynitrides, and UV-nitrides.

* * * * *

UNITED STATES PATENT AND TRADEMARK OFFICE
CERTIFICATE OF CORRECTION

PATENT NO. : 6,342,423 B1
DATED : January 29, 2002
INVENTOR(S) : Emi Ishida et al.

It is certified that error appears in the above-identified patent and that said Letters Patent is hereby corrected as shown below:

Column 9,
Line 34, change "substrates" to -- substrate --;

Column 11,
Line 9, change "par" to -- pair --;

Column 12,
Line 1, change "section" to -- second --.

Signed and Sealed this

Thirtieth Day of April, 2002

Attest:

Attesting Officer

JAMES E. ROGAN
Director of the United States Patent and Trademark Office